United States Patent
Mizuno et al.

(10) Patent No.: US 7,378,031 B2
(45) Date of Patent: May 27, 2008

(54) LIQUID PHASE ETCHING METHOD AND LIQUID PHASE ETCHING APPARATUS

(75) Inventors: Bunji Mizuno, Ikoma (JP); Yuichiro Sasaki, Machida (JP); Ichiro Nakayama, Kadoma (JP); Hisataka Kanada, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 268 days.

(21) Appl. No.: 10/546,015

(22) PCT Filed: Feb. 23, 2004

(86) PCT No.: PCT/JP2004/002073

§ 371 (c)(1),
(2), (4) Date: Aug. 18, 2005

(87) PCT Pub. No.: WO2004/075278

PCT Pub. Date: Sep. 2, 2004

(65) Prior Publication Data

US 2006/0049140 A1  Mar. 9, 2006

(30) Foreign Application Priority Data

Feb. 21, 2003  (JP) .......................... 2003-044550

(51) Int. Cl.
 *B44C 1/22*  (2006.01)
 *C03C 15/00* (2006.01)
 *C03C 25/68* (2006.01)
 *C23F 1/00*  (2006.01)

(52) U.S. Cl. ....................................... 216/83

(58) Field of Classification Search ................ 216/83, 216/86, 92, 57; 438/746, 748
See application file for complete search history.

(56) References Cited

U.S. PATENT DOCUMENTS 4,973,379 A    11/1990  Brock et al.
5,041,229 A *   8/1991  Brock et al. ............... 252/79.1

FOREIGN PATENT DOCUMENTS

| CN | 1124406 A | 6/1996 |
| JP | 4-131388 A | 5/1992 |
| JP | 5-251421 A | 9/1993 |
| JP | 9-27654 A | 1/1997 |
| JP | 2001-15477 A | 1/2001 |
| JP | 2002-16031 A | 1/2002 |

OTHER PUBLICATIONS

Y. L. Chen, et al., Aerosol Jet Etching, Aerosol Science and Technology, 1990, vol. 12, pp. 842 to 855.
International Search Report (Japanese and English language versions) for PCT/JP2004/002073, dated Jun. 1, 2004.

* cited by examiner

*Primary Examiner*—Roberts Culbert
(74) *Attorney, Agent, or Firm*—RatnerPrestia

(57) ABSTRACT

A liquid phase etching method which comprises spraying a chemically reactive liquid, with a specific speed, to a solid article, an aggregate of solid articles or a gelatinous material to be treated; and a liquid etching apparatus having a mechanism for holding a processing object to be treated and a nozzle structure for spraying a chemically reactive liquid to the processing object to be treated which is held by the mechanism. The method and apparatus allow the significant improvement of the etching rate while maintaining the accuracy of etching.

9 Claims, 8 Drawing Sheets

LIQUID PHASE ETCHING METHOD AND LIQUID PHASE ETCHING APPARATUS

THIS APPLICATION IS A U.S. NATIONAL PHASE APPLICATION OF PCT INTERNATIONAL APPLICATION PCT/JP2004/002073.

TECHNICAL FIELD

The present invention relates to a technical field of processing the surface of solid materials or other processing objects, in particular a field of forming fine pattern on them. The field includes, for example, a liquid phase etching method and a liquid phase etching apparatus for use in manufacture of semiconductor device or MEMS (micro-electro-mechanical system) device.

BACKGROUND ART

In processing (etching) process of semiconductor as a typical example of fine patterning, the semiconductor surface is irradiated with reactive gas in plasma state, and the semiconductor is processed into desired shape.

Explaining briefly by referring to FIG. 9, a vacuum chamber 1 is coupled to a vacuum pump 2 for creating vacuum. A processing object like silicon wafer 3 is placed in the vacuum chamber 1, and desired gas is introduced, and plasma 4 is generated to cause interaction with the surface of the processing object, and the processing object is processed. In FIG. 9, the processing object is etched.

Meanwhile, as disclosed in Japanese Patent Unexamined Publication No. H9-27654, the conventional etching was often processed by immersing the solid processing object in liquid. However, etching in the liquid is sufficiently fast in etching processing speed, but is not suited to fine patterning because etching tends to be isotropic.

The reason of using plasma in etching is to make etching anisotropic in order to meet the demand for higher precision in fine patterning.

However, when plasma is used in etching, the processing speed is sacrificed. As a result, in the semiconductor industrial field, typically, it took about 10 minutes to process one wafer.

DISCLOSURE OF THE INVENTION

The etching method of the invention is etching a processing object which may be either solid, solid assembly or gel material, by spraying a chemically reactive liquid at a specified speed.

Also, the etching method of the invention is spraying a chemically reactive liquid to a processing object placed in a vacuum chamber, by using a nozzle mechanism. The degree of vacuum in the vacuum chamber while processing the processing object may be a sufficient degree of vacuum for preventing generation of impulse wave when surpassing the sonic speed at the time of jet injection of liquid.

Also, the etching method of the invention is further characterized by impinging the liquid particles charged on the surface to the processing object, which is either solid, solid assembly or gel material, with induced acceleration and induced deceleration in electric field or magnetic field, by applying an electric charge to injected liquid particles.

Also, the etching method of the invention is further characterized by processing the solid or solid assembly selectively by spraying chemically reactive liquid to the portion exposed from the mask, by covering part of the surface of solid or solid assembly with a resin material and using as mask.

Also, the etching apparatus of the invention is comprising a mechanism for holding a processing object and a nozzle structure for spraying chemically reactive liquid to the held processing object.

By using the liquid phase etching method and liquid phase etching apparatus of the invention, the etching speed can be enhanced substantially.

DETAILED DESCRIPTION OF THE PREFERRED EMBODIMENTS

Figure 1:
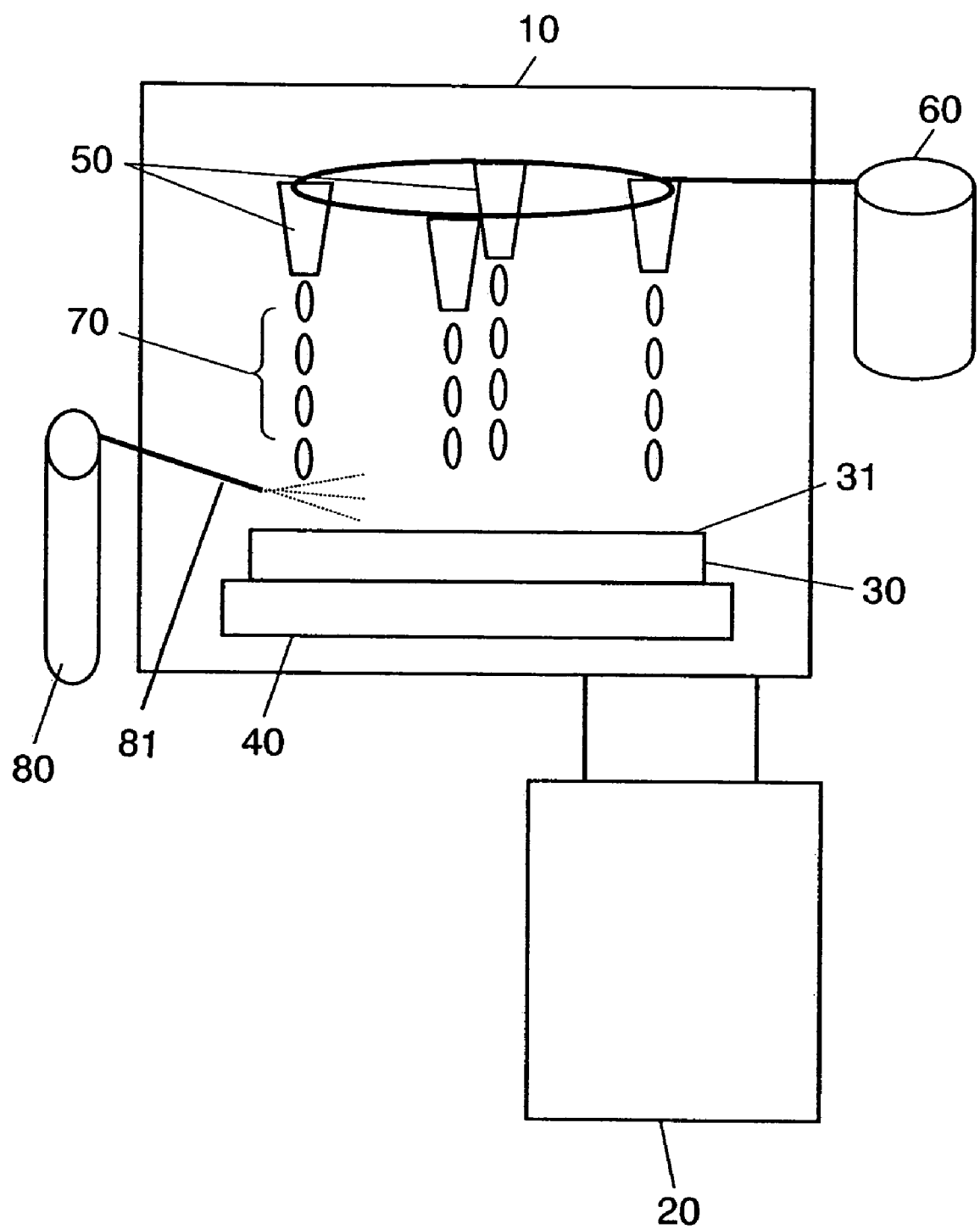
FIG. 1 is a schematic sectional view of liquid phase etching apparatus in an embodiment of the invention.

The invention is intended to realize both characteristics of (1) high speed etching by using liquid and (2) anisotropic etching by using plasma, simultaneously by spraying liquid to the processing object at an extremely high speed, and hence presents a processing technology capable of processing at high speed and having an extremely sharp anisotropy.

The system capable of impinging liquid drops at super high speed also has an effect of generating plasma on the top surface of the processing object when the liquid drops impinge, so that the features of the invention may be exhibited more outstandingly.

The invention enables to transfer the existing "etching process" using plasma to processing in liquid, which is high in processing capability, and hence the productivity is improved from several times to one digit higher. The semiconductor industry requires a tremendous investment for manufacturing equipment. It is extremely difficult to realize the chip unit price worthy of investment, and it is very difficult to adapt to so-called silicon cycle. Therefore, if the etching process time can be improved by one digit, the productivity is enhanced and it is expected to change the industrial structure dramatically.

A preferred embodiment of the invention is described below while referring to the accompanying drawings. In the drawings, the components having same basic function are identified with same reference numerals.

Preferred Embodiment

A preferred embodiment of the invention is explained by referring to embodiment 1. FIG. 1 is an explanatory diagram of liquid phase etching apparatus used in the preferred embodiment. Referring now to FIG. 1, the outline of the etching apparatus of embodiment 1 is explained. A vacuum chamber 10 is coupled to a vacuum pump 20 for creating vacuum. A stage 40 and plural nozzles 50 are placed in the vacuum chamber 10. The stage 40 holds a processing object 30 which is either solid, solid assembly or gel material. The nozzles 50 are connected to a liquid feed device 60 for feeding specified liquid, and particles of chemically reactive liquid 70 can be sprayed to the processing object 30. From a variety of liquid 70 capable of etching the processing object 30, a solvent suited to the processing object is selected and used.

Keeping the vacuum chamber at a higher degree of vacuum than about 1E-3 Torr (that is, at lower pressure), the liquid 70 is sprayed from the nozzles 50 at a speed of over 1000 km/hour. The sprayed liquid 70 wets the processing object surface 31, which is etched simultaneously.

If wettability of liquid 70 on the processing object surface 31 is poor, a surface active agent is sprayed to the processing object surface from a spray outlet 81 of a surface active agent feed device 80. The surface active agent may be sprayed before spraying of liquid 70, simultaneously with spraying, or right after spraying of liquid 70. By the presence of surface active agent, the liquid 70 permeates into all parts of the processing object surface 31, and it is etched uniformly.

For example, when the liquid 70 is sprayed to the processing object 30 by accelerating to a speed of more than 10,000 km/hour, part of liquid components may be transformed into plasma by gaining a high energy. The generated plasma is effective to activate the processing object surface 31, and further accelerate the etching process speed.

Anticorrosive processing of nozzles 50 is explained.

Nozzles are not always made of materials excellent in corrosion resistance. If nozzles are made of materials not so high in corrosion resistance, the nozzle basic shape is formed by using a material suited to nozzle processing, and the surface directly contacting with the etching liquid must be coated with an anticorrosive substance. This coating process is either irradiation of nozzle surface directly with plasma mainly composed of desired anticorrosive substance, or irradiation of nozzle surface with plasma for generating an anticorrosive substance by reacting with the material forming the basic shape. Coating the nozzle surface with an anticorrosive substance enables the corrosion resistance of the nozzle to the etching liquid to improve remarkably.

Figure 4:
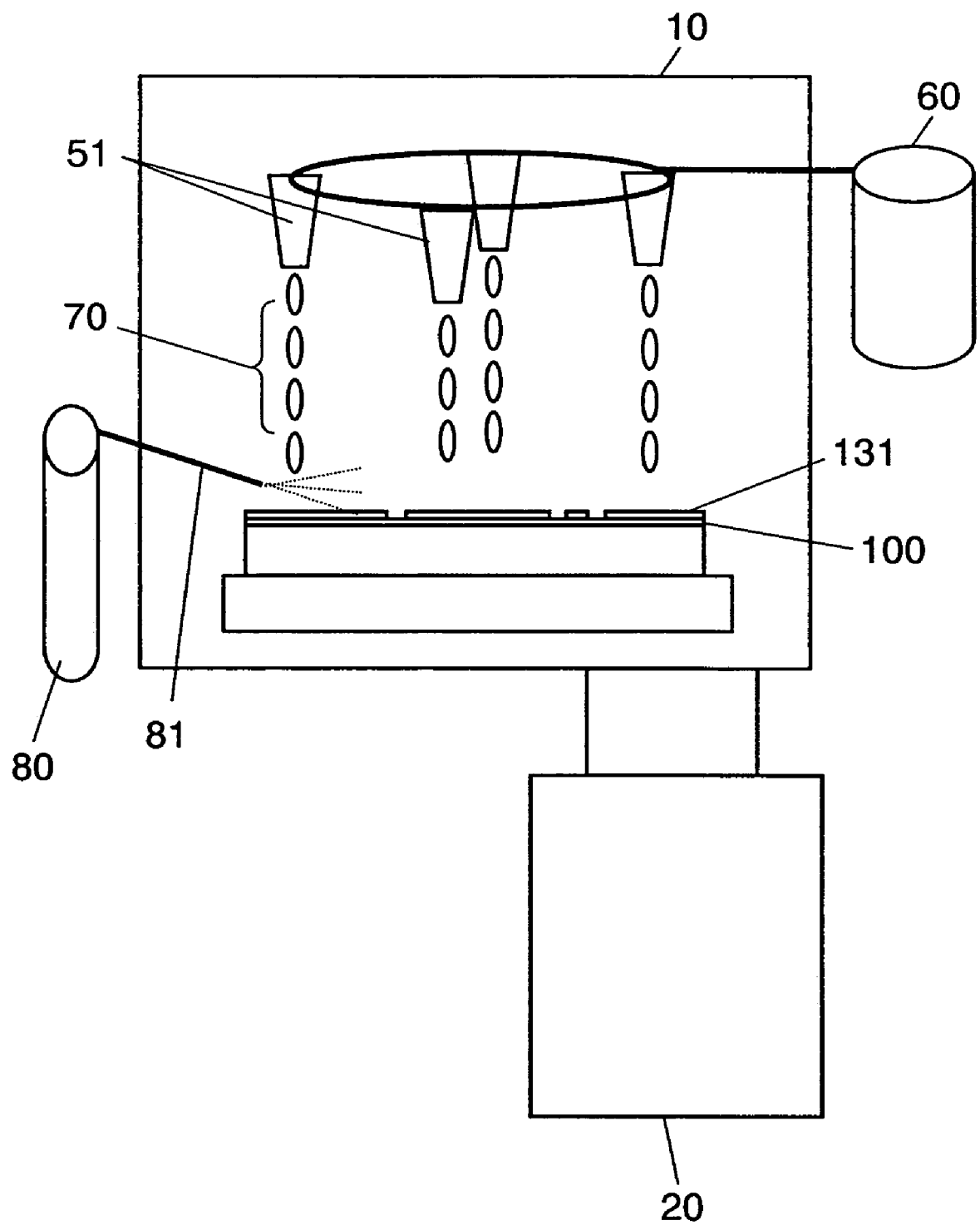
FIG. 4 is a schematic sectional view of liquid phase etching apparatus in the embodiment of the invention.

Other processing process of the preferred embodiment of the invention is explained by referring to embodiment 2. FIGS. 2A to 2D, FIGS. 3A to 3C and FIG. 4 explain embodiment 2. FIGS. 2A to 2D are process charts of embodiment 2 showing the process in the case of using the photo resist as mask and semiconductor as processing object. FIGS. 3A to 3D are process charts of embodiment 2 showing the process in the case of using the coating substance as mask and semiconductor as processing object. And FIG. 4 is an explanatory diagram of etching apparatus of embodiment 2 in the case of using semiconductor as processing object.

As an example of fine patterning of processing object 30, the latest processing of fine patterning of semiconductor device is explained.

In 2002, generally, the semiconductor is processed more finely than 0.25 μm. Accordingly, the size of fine particles of liquid 70 for processing it should be smaller than 0.2 μm. The size of fine particles may be small enough for the factor determining the size of the object of processing (critical dimension). If the required processing precision is large, the size of a corresponding particle may be selected from sizes smaller than the required processing precision. In embodiment 2, the etching apparatus includes nozzles 50 for forming fine particles smaller than 0.2 μm, or supersonic nozzles 51 for forming liquid fine particles at higher speed. In the invention, the supersonic nozzles spray liquid fine particles at a speed of no less than 1000 km/hour, or more preferably spray liquid fine particles by accelerating to a speed of no less than 3,000 km/hour.

Referring to FIG. 2, the semiconductor substrate to be processed is explained. As an example of semiconductor substrate, a silicon wafer 90 forming a thin film 100 of a substance necessary for forming a semiconductor element thereon is used. The semiconductor substrate to be processed is silicon substrate, or silicon substrate forming silicon oxide film, silicon nitride film, oxide film of rare earth elements, or metal film of aluminum or copper, thereon.

Although there are various liquid for etching the thin film 100 of processing object material, a solvent suitable for the material of the semiconductor substrate to be processed is selected and used.

The degree of vacuum of vacuum chamber 10 is kept higher than about 1E-3 Torr, and the liquid 70 is sprayed from the nozzles 50 at a speed of no less than about 1000 km/hour. When the sprayed liquid reaches and wets the processing object surface 31, it is etched at the same time. Depending on a relation between processing object surface 31 and liquid 70, a surface active agent is used for the liquid permeating into all parts of the processing object surface 31, and for obtaining a homogeneous etching effect. If wetting of liquid 70 on the processing object surface 31 is poor, by spraying the surface active agent to the processing object surface, the liquid 70 is distributed in all parts of the processing object surface 31, so that uniform etching is attained.

For example, if the liquid 70 reaches the processing object at a high speed exceeding about 10,000 km/hour, part of liquid components may be transformed into plasma by receiving high energy. The generated plasma activates the processing object surface, and may further accelerate the etching speed.

Figure 2A:
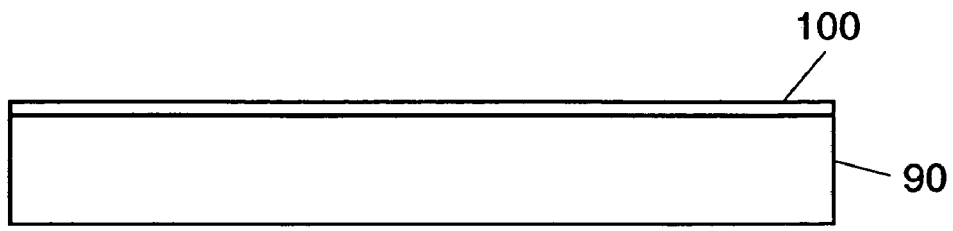
FIGS. 2A to 2D are process charts showing other processing process in the embodiment of the invention.
Figure 2B:
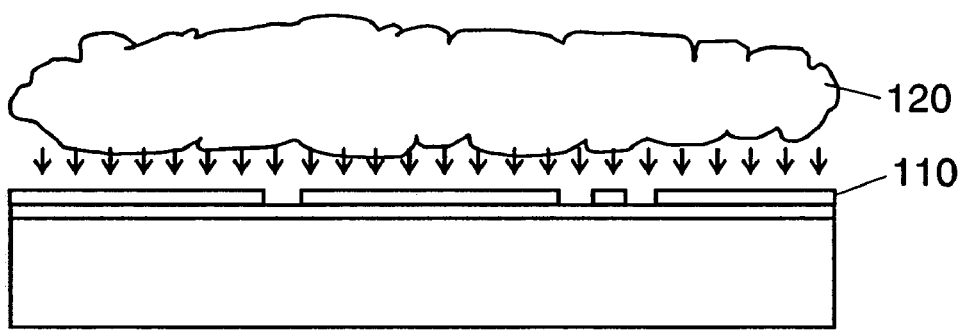

When manufacturing a semiconductor device, it may be required to process in a very fine size of 0.1 μm smaller than 0.25 μm. In such a case, as shown in FIG. 2B, a photo resist 110 is formed on the thin film 100, using it as mask, it may be processed in desired pattern and size by using the so-called lithography. At this time, in order to provide the photo resist with corrosion resistance to withstand liquid phase etching, it is preferred to process the surface of photo resist 110 preliminarily by plasma 120 as shown in FIG. 2B.

Figure 2C:
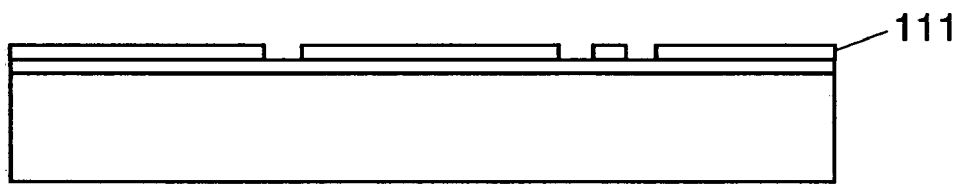
Figure 2D:
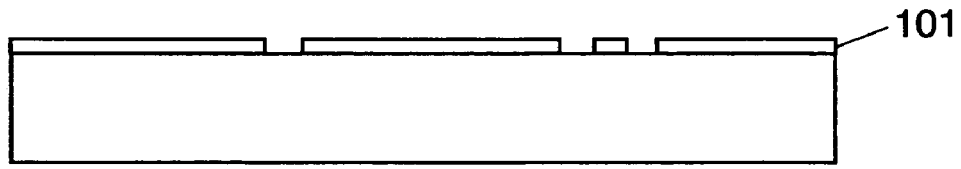
Figure 3A:
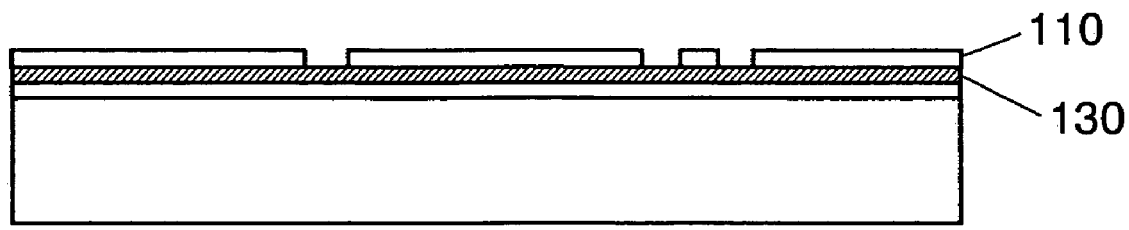
FIGS. 3A to 3C are process charts showing other processing process in the embodiment of the invention.
Figure 3B:
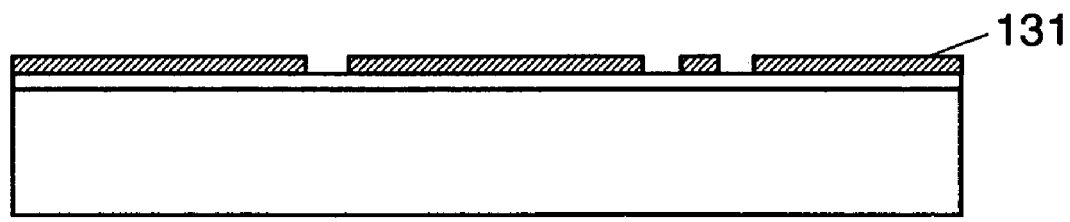
Figure 3C:

By plasma processing of the surface of the photo resist composed of organic materials, polymerization reaction of organic materials takes place on the surface. By this reaction, cross linking of organic materials on the surface is promoted, so that an anticorrosive photo resist 111 obtained as shown in FIG. 2C. An appropriate plasma 120 may be determined in consideration of: plasma of rare gases; interaction with substance for composing the photo resist 110; interaction with etching liquid 70 such as solvents, acid or alkali to be used.

Depending on the combination of etching liquid 70 such as solvents, acid or alkali to be used, sufficient corrosion resistance may not be achieved in the photo resist 110 mainly composed of organic materials.

In such a case, as shown in FIG. 3, a coating substance 130 made of material having enough corrosion resistance is applied on the surface of the processing object 100, and liquid phase etching is executed by using the coating substance 130 as mask. In embodiment 2, the processing object corresponds to the thin film 100 formed on the surface of silicon substrate 90.

At first, using the photo resist 110 as mask, the coating substance 130 is etched by using etching liquid 70, such as solvent, acid or alkali, capable of etching the coating substance 130.

Further, using the patterned coating substance 131 as mask, as shown in FIG. 4, in the vacuum chamber 10, the processing object 100 is etched in liquid phase and processed as desired by spraying the solvent and acidic or alkaline etching liquid 70 for etching the processing object 100 from the supersonic nozzles 51. The vacuum degree in the vacuum chamber 10 is kept at degree of vacuum higher than 1E-3 Torr (that is, lower pressure), and the liquid 70 is sprayed from nozzles 51 at a speed of higher than 1,000 km/hour. The degree of vacuum is thus maintained in order to prevent generation of impulse waves or the like by surpassing the sonic speed at the time of jet injection of the chemically reactive liquid.

By the method explained above, the semiconductor substrate or other thin film to be processed can be processed very finely according to the mask pattern.

Other processing process of the preferred embodiment of the invention is explained below by referring to embodiment 3. In manufacture of semiconductor device in which precision processing is required, overhang of etching groove or forming of taper may cause to worsen the processing precision. Hence, there is a strong demand for an etching method of digging groove in the vertical direction from the surface of flat solid body.

Figure 5:
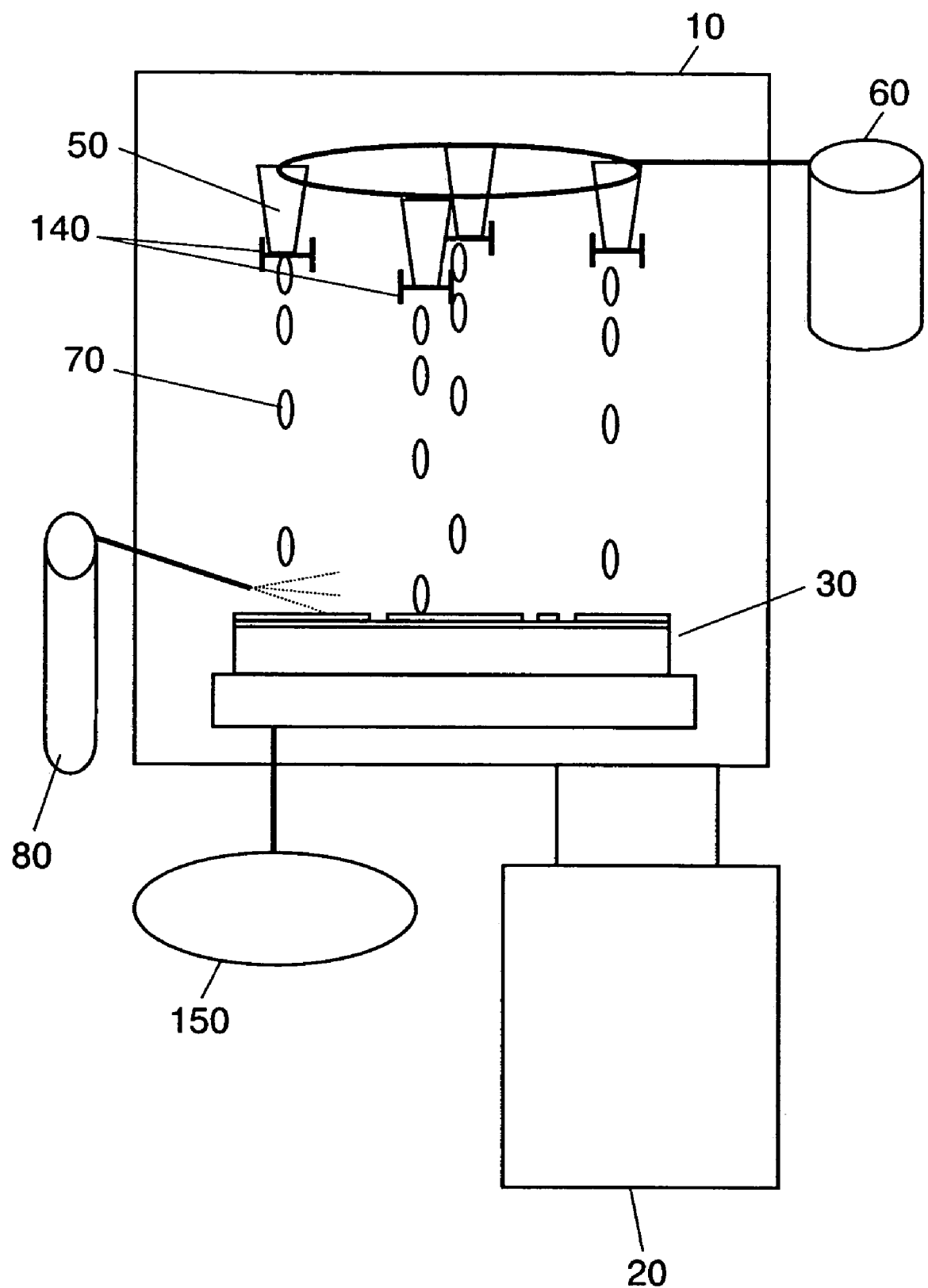
FIG. 5 is a schematic sectional view of another liquid phase etching apparatus in the embodiment of the invention.
Figure 6:
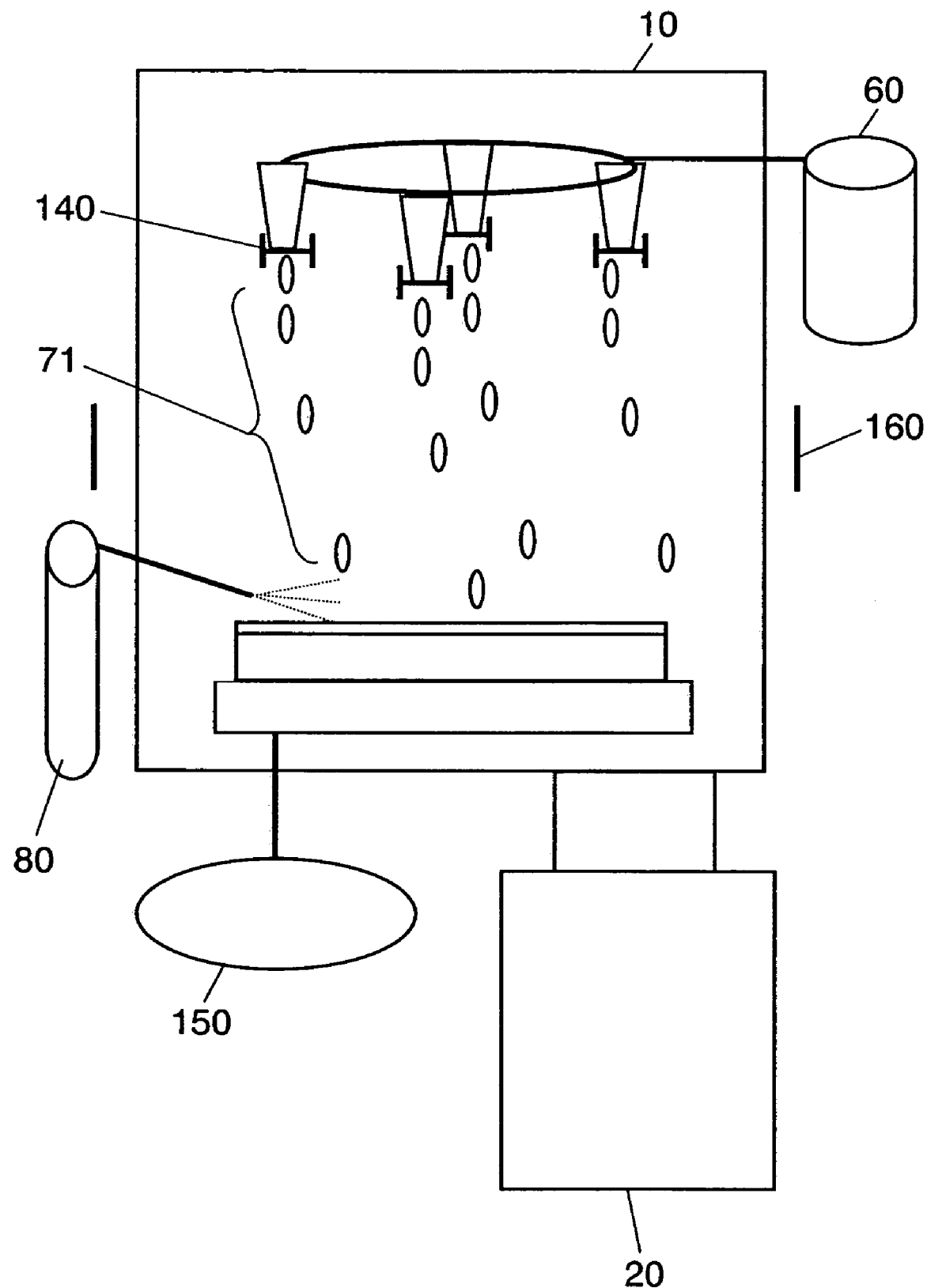
FIG. 6 is a schematic sectional view of another liquid phase etching apparatus in the embodiment of the invention.

Embodiment 3, by referring to FIG. 5 and FIG. 6, explains an etching method of digging groove in the vertical direction by making use of electric field or magnetic field at the time of etching process.

FIG. 5 is an explanatory diagram of etching apparatus for accelerating the liquid 70 by applying an electric field to the processing object in embodiment 3 of the invention, and FIG. 6 is an explanatory diagram of etching apparatus for accelerating the liquid 70 in rotating direction by applying a magnetic field to the vacuum chamber in embodiment 3 of the invention.

As shown in FIG. 5, a charging mechanism 140 is provided at the outlet or near the outlet of the nozzles 50, and an electric charge is applied to the ejecting pulverized liquid (that is, liquid particles) 70. By making use of this electric charge, the ejecting pulverized liquid 70 is provided with freedom in directivity. For this purpose, a voltage application mechanism 150 is provided for applying a voltage to the stage holding the semiconductor solid.

The liquid 70 sprayed out from the nozzles 50 is first provided with an electric charge by the charging mechanism 140, and is accelerated by the voltage application mechanism 150 and reaches the processing object 30. The applicable voltage is limited by electric discharge or leak varying with the structure of the apparatus or electrical characteristic of the liquid to be used. This problem will be further discussed in embodiment 5. By applying the voltage intermittently by combining with a system of promoting vaporization of the liquid used in the etching, effects of current leak or the like may be prevented.

Further, as shown in FIG. 6, by using a magnetic field application mechanism 160 for applying a magnetic field, the liquid 71 can be accelerated in the rotating direction, and the motion trajectory can be varied, and the direction can be controlled freely. Reference numeral 71 refers to the liquid rotated in its trajectory.

Another processing process of the preferred embodiment of the invention is explained below by referring to embodiment 4. Only one nozzle 50 for injecting liquid may be used in etching process, but when the processing object such as a solid has a certain area, if only one nozzle is used then, the incident angle to the surface of the pulverized liquid particles varies depending on the location of the processing. This is the same phenomenon as a flat surface illuminated by a spot light source varies in luminance depending on the location. Therefore, to process uniformly on the entire surface of the processing object, it is effective to use plural nozzles. In embodiment 4, a case of using the plural nozzles is explained.

Figure 7:
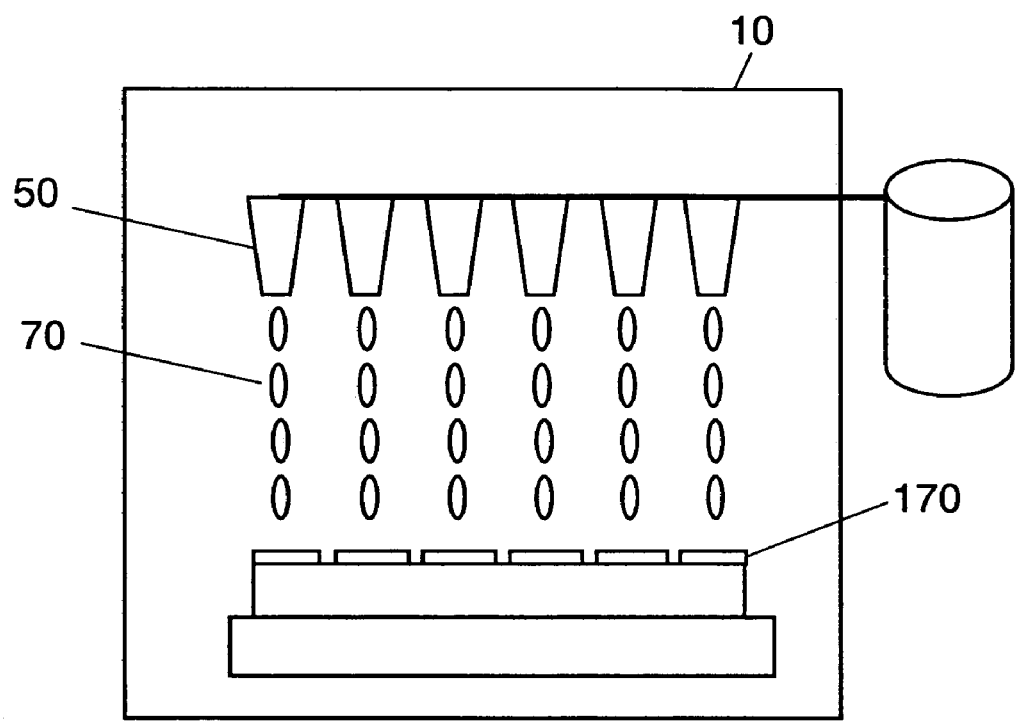
FIG. 7 is a schematic sectional view of a different liquid phase etching apparatus in the embodiment of the invention.
Figure 8:
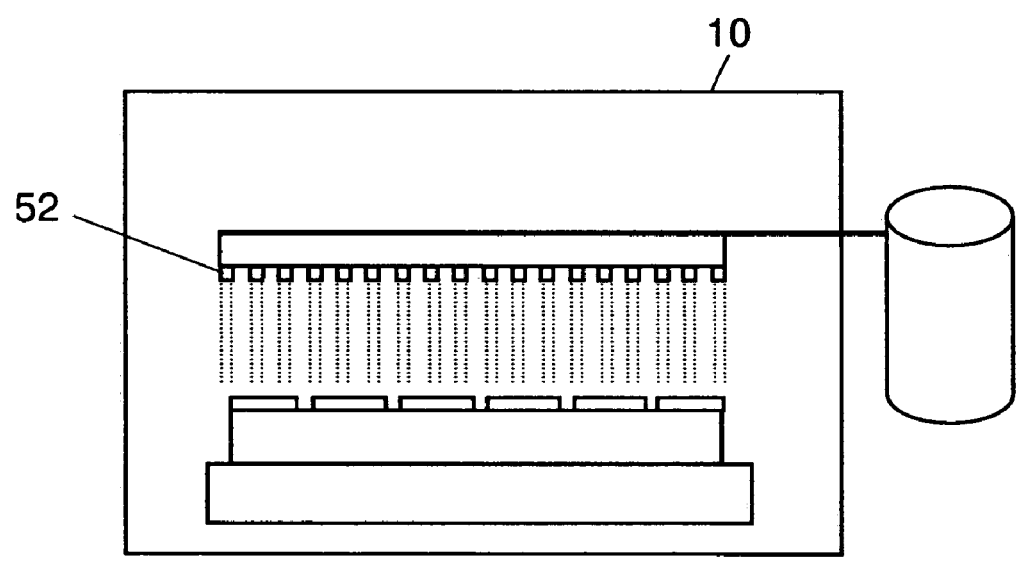
FIG. 8 is a schematic sectional view of a further liquid phase etching apparatus in the embodiment of the invention.
Figure 9:
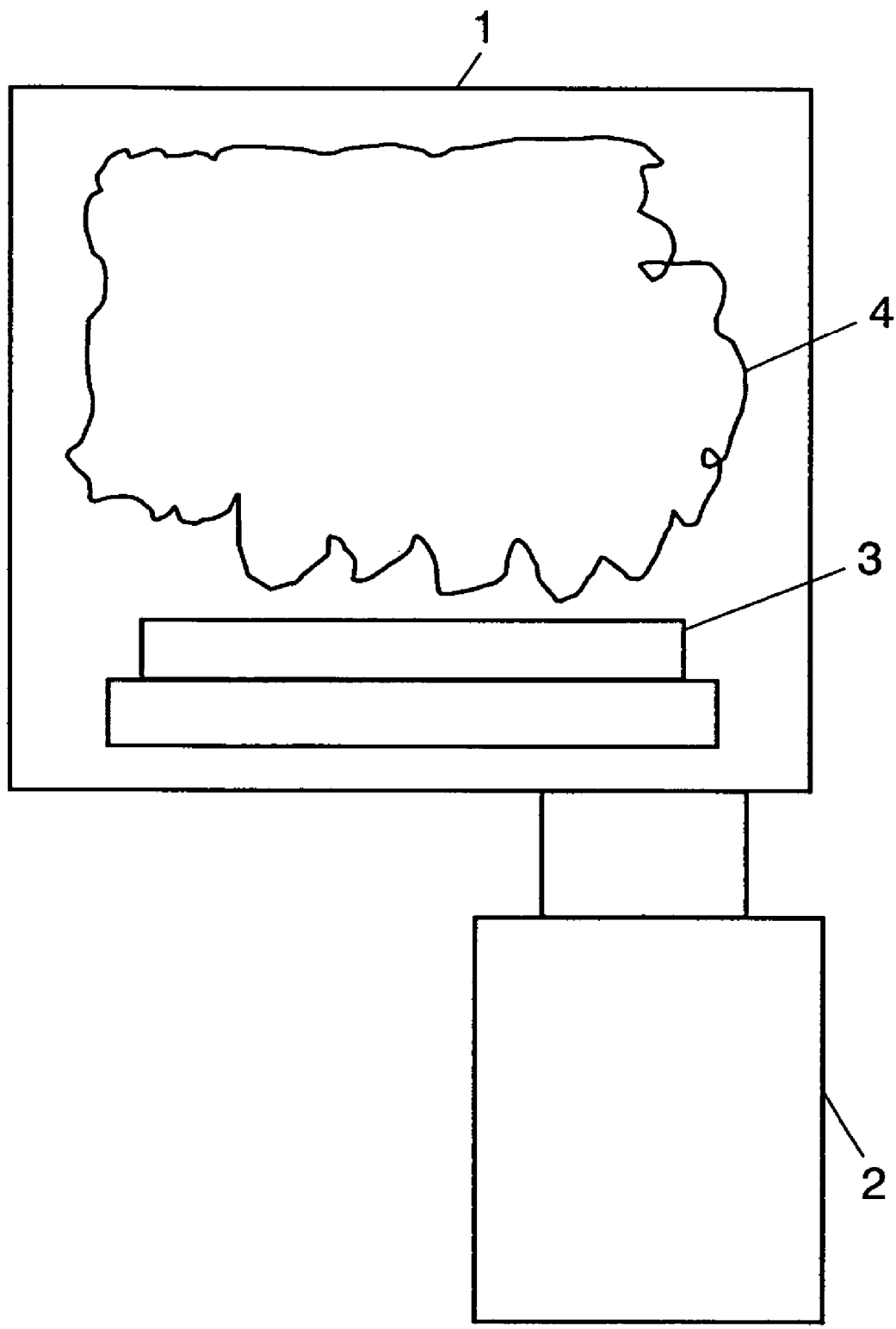
FIG. 9 is a schematic sectional view of plasma etching apparatus in a prior art.

FIG. 7 shows an etching apparatus in embodiment 4 of the invention, in which nozzles are provided at every individual semiconductor chip. FIG. 8 shows an etching apparatus having numerous fine nozzles by making use of MEMS in embodiment 4 of the invention.

For example, in the manufacturing process of silicon semiconductor, plural chips 170 are formed at intervals of about 1 cm. As shown in FIG. 7, nozzles 50 are installed immediately above the individual chips 170, and the angle variation of liquid 70 may be minimized. Besides, by installing the plural nozzles in every chip, effects of angle changes may be minimized.

Further, as shown in FIG. 8, for example, by using micro nozzles 52 making use of MEMS or micro machining, nozzles may be disposed at intervals of several microns. At this time, etching may be carried out using nozzles densely installed in an area corresponding to the entire surface of the processing object. Or by installing nozzles in a specific area, and by moving the nozzles or the processing object, the entire surface of the processing object may be etched. In FIG. 8, each nozzle is shown in magnified view for the sake of explanation.

A further processing process of the preferred embodiment of the invention is explained below by referring to embodiment 5. Depending on the characteristic of the etching liquid, such as solvent, acid or alkali, used in liquid phase etching, the time of vaporization of the liquid used in the etching in the vacuum chamber 10 varies.

When the vaporization speed is sufficiently fast, the sprayed liquid is soon vaporized after a specified etching time and there is no problem. If the vaporization speed is slow, the liquid remains after necessary etching time, which may lead to etching defects. Accordingly, when the vaporization speed is slow, it is required to prevent excessive supply of liquid by controlling the spraying amount of the etching liquid. To solve this problem, the liquid feed device 60 includes an intermittent spray circuit or intermittent spray device (not shown), and the liquid is sprayed from the nozzles intermittently, and it is preferred to set a necessary time interval for allowing the etching liquid to be evaporated after being sprayed out.

In the foregoing preferred embodiment, it is desired to spray the chemically reactive liquid at super high speed, but if not so high, the speed may be enough as far as part or most of liquid components can be transformed into plasma.

INDUSTRIAL APPLICABILITY

As explained herein, the invention presents a liquid phase etching method capable of spraying an etching liquid to the processing object at a high speed, and is intended to enhance the etching speed substantially while maintaining anisotropy or other fine patterning performance of dry etching.

The invention claimed is:

1. A liquid phase etching method comprising the steps of:
spraying a chemical reactive liquid to a processing object at a specified speed, by using a nozzle mechanism; and
etching the processing object by the sprayed liquid,
wherein the spraying step is conducted in a vacuum atmosphere of higher degree of vacuum than 1E-3 Torr, thereby preventing occurrence of impulse waves surpassing the sonic speed at the time of injection of the liquid.

2. The liquid phase etching method of claim 1, wherein the spraying step is the step of spraying the liquid to the processing object as liquid particles smaller than 0.2 μm.

3. The liquid phase etching method of claim 1, wherein the spraying step includes the steps of:
applying an electric charge to particles of the liquid, and
applying an electric field or magnetic field to the charged liquid particles, and the liquid particles are impinged on the processing object surface by induced acceleration or induced deceleration.

4. The liquid phase etching method of claim 3, wherein electrons are supplied on the surface of the processing object which is electrically insulated from a holding mechanism.

5. The liquid phase etching method of claim 1 further comprising the step of coating part of the processing object with a coating material before the spraying step, wherein the etching step is a step of etching only the uncoated portion of the processing object with the liquid.

6. The liquid phase etching method of claim 1 further comprising the following sequential steps before the spraying step:
forming a thin film of substance not reacting with the liquid on the surface of the processing object;
coating part of the thin film with a coating material; and
etching the thin film by using the coating material as a mask,
wherein the etching step is a step of etching the processing object by using the etched thin film as mask.

7. The liquid phase etching method of claim 1, wherein the spraying step is a step of spraying a surface active agent on the surface of the processing object, simultaneously with the spraying of liquid, or before or after the spraying.

8. The liquid phase etching method of claim 1, wherein the spraying step is a step of spraying the liquid intermittently by using the nozzle mechanism.

9. The liquid phase etching method of claim 8, wherein the time interval of spraying the liquid intermittently at the spraying step is determined, depending on the etching speed of the processing object by the liquid, and on vaporization speed or elimination speed of the liquid containing the etched substance at the end of etching in the vacuum atmosphere.

* * * * *